US010248020B2

(12) United States Patent
Thackeray et al.

(10) Patent No.: US 10,248,020 B2
(45) Date of Patent: Apr. 2, 2019

(54) ACID GENERATORS AND PHOTORESISTS COMPRISING SAME

(71) Applicant: Rohm and Haas Electronic Materials LLC, Marlborough, MA (US)

(72) Inventors: James W. Thackeray, Braintree, MA (US); Paul J. LaBeaume, Auburn, MA (US); James F. Cameron, Brookline, MS (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/730,273

(22) Filed: Dec. 28, 2012

(65) Prior Publication Data

US 2014/0186767 A1 Jul. 3, 2014

(51) Int. Cl.
*G03F 7/004* (2006.01)
*G03F 7/028* (2006.01)
*G03F 7/029* (2006.01)
*G03F 7/20* (2006.01)
*G03F 7/038* (2006.01)
*G03F 7/039* (2006.01)

(52) U.S. Cl.
CPC .......... *G03F 7/0045* (2013.01); *G03F 7/0046* (2013.01); *G03F 7/0382* (2013.01); *G03F 7/0392* (2013.01); *G03F 7/0397* (2013.01)

(58) Field of Classification Search
CPC . G03F 7/004; G03F 7/028; G03F 7/20; G03F 7/2002; G03F 7/029
USPC ............. 430/270.1, 322, 921, 922, 923, 925
See application file for complete search history.

(56) References Cited

U.S. PATENT DOCUMENTS

| 5,824,824 A | 10/1998 | Osawa et al. |
| 5,880,169 A | 3/1999 | Osawa et al. |
| 6,727,036 B2 * | 4/2004 | Kanna ................... G03F 7/0045 430/270.1 |
| 6,803,169 B2 | 10/2004 | Cameron et al. |
| 6,808,862 B2 | 10/2004 | Kodama |
| 7,314,700 B2 | 1/2008 | Huang et al. |
| 7,488,568 B2 | 2/2009 | Iwai et al. |
| 7,776,510 B2 | 8/2010 | Iwai et al. |
| 2003/0224285 A1 | 12/2003 | Nakao et al. |
| 2007/0244454 A1 | 10/2007 | Fujikawa et al. |
| 2008/0248422 A1 | 10/2008 | Iwai et al. |
| 2010/0143830 A1 | 6/2010 | Ohashi et al. |
| 2010/0183975 A1 | 7/2010 | Takahashi et al. |
| 2010/0304296 A1 | 12/2010 | Ichikawa et al. |
| 2012/0065291 A1 | 3/2012 | Matsumura et al. |
| 2013/0034813 A1 * | 2/2013 | Ohsawa et al. ............ 430/281.1 |
| 2013/0095427 A1 * | 4/2013 | Yahagi et al. ............. 430/285.1 |
| 2013/0157197 A1 * | 6/2013 | Komuro .................. G03F 7/027 430/285.1 |

FOREIGN PATENT DOCUMENTS

| EP | 1906241 A1 | 4/2008 |
| JP | 2009151259 A | 7/2009 |
| JP | 04369375 B2 | 11/2009 |
| JP | 2010111653 A | 5/2010 |
| JP | 04724465 B2 | 7/2011 |
| JP | 2011158879 A | 8/2011 |
| JP | 2012220572 A | 11/2012 |
| JP | 2013088572 A | 5/2013 |
| JP | 2013101222 A | 5/2013 |
| JP | 2013125146 A | 6/2013 |
| JP | 2013161060 A | 8/2013 |

OTHER PUBLICATIONS

Raamat E., Kaupmees K., Ovsjannikov G., Trummal A., Kutt A., Saame J., Koppel I., Kaljurand I., Lipping L., Rodima T., Pihl V., Koppel I., Leito I.—Acidities of strong neutral Bronsted acids in different media, Journal of Physical Organic Chemistry, 2013, 26, pp. 162-170.*
Machine translation of JP 2009-151259, published on Jul. 9, 2009 (Year: 2009).*
Machine translation of JP 2012-220572, published on Nov. 12, 2012 (Year: 2012).*
English Language Summary of Office Action issued in Counterpart Taiwan Application No. 104-2(6) 01238-10420445200, dated Apr. 8, 2015 (4 Pages).
English Language Summary of Office Action issued in Counterpart Japanese Application No. 2013-264097, Dated Aug. 18, 2017 (5 Pages).
English Language Summary of Office Action issued in Counterpart Chinese Application No. 201310757451.5 (2 Pages). date unknown.

* cited by examiner

*Primary Examiner* — Anca Eoff
(74) *Attorney, Agent, or Firm* — Mintz Levin Cohn Ferris Glovsky and Popeo, P.C.; Peter F. Corless

(57) ABSTRACT

Acid generator compounds are provided that are particularly useful as a photoresist composition component. In one preferred aspect, photoresists are provided that comprise (i) a polymer; (ii) a first onium salt acid generator that produces a first acid upon exposure of the photoresist composition to activating radiation; and (iii) a second onium salt acid generator that 1) comprises a covalently bound acid-labile moiety and 2) produces a second acid upon exposure of the photoresist composition to activating radiation, wherein the first acid and second acid have pKa values that differ by at least 0.5.

16 Claims, No Drawings

ACID GENERATORS AND PHOTORESISTS COMPRISING SAME

1. FIELD

In one aspect, the present invention relates to new photoresist compositions that comprise a first onium salt acid generator; a second onium salt acid generator that comprises a covalently bound acid-labile moiety, and wherein the first and second onium salts upon exposure to activating radiation produce acids that have differing pKa values.

2. INTRODUCTION

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating.

Known photoresists can provide features having resolution and dimension sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See US 20070224540 and EP 1906241. See also US 2012/0065291. Extreme ultraviolet (EUV) and e-beam imaging technologies also have been employed. See U.S. Pat. No. 7,459,260. EUV utilizes short wavelength radiation, typically between 1 nm to 40 nm, with 13.5 nm radiation often employed.

EUV photoresist development continues to be a challenging issue for EUV Lithography (EUVL) technology implementation. Required are development of materials that can provided highly resolved fine features, including low linewidth roughness (LWR), and sufficient sensitivity to afford wafer throughput.

SUMMARY

We have now discovered new photoresist compositions that comprise a blend of acid generators wherein the acid generators upon exposure to activating radiation produce acids of differing pKa values and at least one acid generator comprises a covalently linked acid-labile moiety.

Without being bound by theory, it is believed that in certain preferred systems, the acid generator with the weaker acid anion component may function as a type of photodestroyable quencher compound thereby decreasing the non-complexed base concentration in the exposed region which can result in higher contrast and e.g. improved LWR (line width roughness), CDU and CER. Other perceived benefits can include faster photospeed and improved exposure latitude.

In preferred aspects, acid generator compounds and photoresists of the invention are particularly useful for EUV imaging.

In one preferred aspect, photoresist compositions are provided comprising (i) a polymer; (ii) a first onium salt acid generator; and (iii) a second onium salt acid generator that comprises a covalently bound acid-labile moiety; wherein the first and second onium salts upon exposure to activating radiation produce distinct acids that have pKa values that differ by at least 0.5. The first and second onium salts also suitably may produce respective acids that differ in pKa values in greater amounts, e.g. where the acid (first acid) produced upon exposure of the first onium salt to activating radiation differs in pKa value by at least 0.5, 1, 1.2, 1.5, 1.7, 2, 2.2, 2.5, 2.7, 3, 3.2, 3.5, 3.7 or 4.0 relative to the pKa of the acid (second acid) produced upon exposure of the second onium salt to activating radiation.

Additionally, in one aspect, the pKa value of the first acid produced by the first onium salt is lower than the pKa value of the second acid produced by the second onium salt. In another aspect, the pKa value of second acid produced by the second onium salt is lower than the pKa value of first acid produced by the first onium salt.

In another preferred aspect, photoresist compositions are provided that comprise: (i) a polymer; (ii) a first onium salt acid generator that comprises a sulfonate anion with at least one electron withdrawing substituent in the α position of the sulfonate moiety; and (iii) a second onium salt acid generator and that comprises (a) a covalently bound acid-labile moiety and (b) a sulfonate, carboxylate or sulfamate anion that does not contain an electron withdrawing group in the α position to the sulfonate, carboxylate or sulfamate moiety.

In certain aspects, one of the acid generators will have a relatively weak acid anion component, e.g. an anion component that has a pKa of 1.0 or greater, 1.5 or greater, 2.0 or greater, 2.5 or greater, 3.0 or greater, or 4.0 or greater.

In certain aspects, one of the acid generators will have a relatively stronger acid anion component, e.g. an anion component that has a pKa of less (more negative) than 1.0, or a pKa of less (more negative) than 0, or a pKa of less (more negative) than ⁻1.0, or a pKa of less (more negative) than ⁻3.0, or a pKa of less (more negative) than ⁻5.0, or a pKa of less (more negative) than ⁻10.0, or a pKa of less (more negative) than ⁻12.5, or a pKa of less (more negative) than ⁻15.

The molar PAG to quencher ratio (ratio of lower pKa PAG to higher pKa PAG) may be 5 to 40, more preferably 8 to 30, and more preferably 10 to 25. The molar PAG to quencher ratio may be subsidized by the use of a classic quencher wherein the total percentage of quencher coming from a classic quencher is 1% to 99%, more preferably 10% to 75% and more preferably 25 to 60%. Such classic quenchers are those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, tetrakis(2-hydroxypropyl)ethylenediamine; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), amides like tert-butyl 1,3-dihydroxy-2-(hydroxymethyl)propan-2-ylcarbamate and tert-butyl 4-hydroxypiperidine-1-carboxylateor; or ionic quenchers including quaternary alkyl ammonium salts such as tetrabutylammonium hydroxide (TBAH) or tetrabutylammonium lactate.

In resist compositions of the invention, the first and second acid generators preferably are independently either iodonium or sulfonium compounds. In certain aspects, both the first and second acid generators are sulfonium compounds.

In another preferred aspect, photoresist compositions of the invention may comprise:

(i) a polymer;
(ii) an acid generator that corresponds to the following Formula (I):

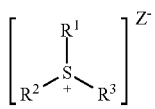

(I)

wherein $R^1$, $R^2$ and $R^3$ are the same or different non-hydrogen substituents and any of $R^1$, $R^2$ and $R^3$ may be taken together to form a ring, and Z is a sulfonate anion with at least one electron withdrawing substituent in the α position of the sulfonate moiety; and (iii) an acid generator that corresponds to the following Formula (II):

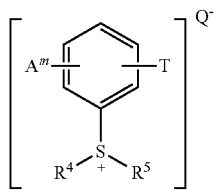

(II)

wherein $R^4$ and $R^5$ are the same or different non-hydrogen substituents and may be taken together to form a ring; or either $R^4$ or $R^5$ may form a ring with the aromatic substituent; A is a hydrogen or non-hydrogen substituent; m is an integer from 0 to 4; T is a non-hydrogen substituent that provides an acid-labile moiety; and Q is a carboxylate, sulfonate or sulfamate anion that does not contain an electron withdrawing group in the α position to the carboxylate, sulfonate or sulfamate moiety.

In a preferred embodiment, the acid generator of the above Formula (I) corresponds to the following Formula (III):

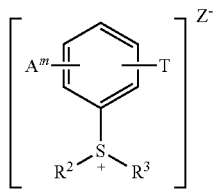

(III)

wherein $R^2$ and $R^3$ are the same or different non-hydrogen substituents and may be taken together to form a ring; or either $R^2$ or $R^3$ may form a ring with the aromatic substituent; A is a hydrogen or non-hydrogen substituent; m is an integer from 0 to 4; T is a non-hydrogen substituent that provides an acid-labile moiety; and Z is a sulfonate anion with at least one electron withdrawing substituent in the α position of the sulfonate.

In a further preferred aspect, the acid generator of the above Formula (II) corresponds to the following Formula (IV):

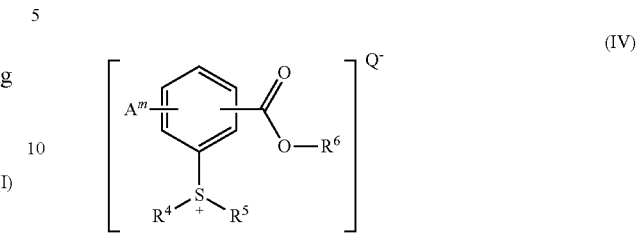

(IV)

wherein $R^4$ and $R^5$ are the same or different non-hydrogen substituents and may be taken together to form a ring; or either $R^4$ or $R^5$ may form a ring with the aromatic substituent; A is a hydrogen or non-hydrogen substituent; m is an integer from 0 to 4; $R^6$ is a non-hydrogen substituent that provides an acid-labile moiety; and Q is a carboxylate, sulfonate or sulfamate anion that does not contain an electron withdrawing group in the α position to the carboxylate, sulfonate or sulfamate moiety.

In certain preferred aspects, in any of the above Formulae (I) through (IV), suitably Z may be bound to the polymer and/or Q may be bound to the polymer.

In further certain preferred aspects, either or both of Formulae (I) and (II) contains either a thioxanthone or dibenzothiophene moiety.

In certain preferred aspects, an acid generator of the invention may be covalently linked to a polymer. Such polymer may be suitably utilized as a component of a photoresist composition, including being linked to a matrix polymer having acid-labile groups in the case of a chemically-amplified positive resist. Thus, the polymer may comprise acid-labile groups in addition to the covalently linked acid generator compounds. In such aspects, suitably the anion component but not the cation component of an ionic acid generator compound of the invention may be covalently linked to a polymer, or the cation component but not the anion component of the acid generator may be covalently linked to a polymer, or each of the anion and cation components of the acid generator may be covalently linked to a polymer.

In preferred aspects, acid generator compounds may comprise a cation component with covalently bound acid labile group, where the acid-labile group cleavage product comprises a relatively bulky moiety, e.g. a carboalicyclic (non-aromatic ring with all carbon ring atoms), heteroalicyclic (non-aromatic ring with one or more N, O or S ring atoms), aromatic groups such as optionally substituted phenyl, naphthyl and anthracreneyl. For example, preferred are such acid-labile groups that comprise an optionally substituted cyclopentyl, cyclohexyl, cycloheptyl, cyclooctyl, adamantyl, phenyl, napthyl or other group having from 5 to 20 or more ring atoms in a single or multi-ring structure.

Particularly preferred photoresists of the invention may comprise an imaging-effective amount of two or more acid generator compounds as disclosed herein and a suitable polymer component.

Methods are also provided for forming relief images of photoresist compositions of the invention (including patterned lines with sub sub-50 nm or sub-20 nm dimensions). Substrates such as a microelectronic wafer also are provided having coated thereon a photoresist composition of the invention.

DETAILED DESCRIPTION

As referred to herein, acid generators can produce an acid when exposed to activating radiation, such as EUV radiation, e-beam radiation or other radiation sources such as 193 nm wavelength radiation. Acid generator compounds as referred to herein also may be referred to as photoacid generator compounds.

References herein to pKa values of acids generated from acid generators designate values as calculated with ACD Labs (Advanced Chemistry Development, Inc., Toronto, Canada) structure design software version 12.5.

Also, as should be understood, as referred to herein, including with reference to Formulae, (I), (II), (III) and/or (IV), an electron-withdrawing moiety in an α position of a sulfonate moiety includes where a carbon atom that has one or more electron-withdrawing substituents such as halogen (including fluoro), cyano, nitro, etc. is directly linked (no interposing atoms between the carbon atom and sulfonate S) to the sulfonate moiety. Thus, for instance, the groups —CF$_2$—SO$_3^-$ and —CH(CN)—SO$_3^-$ are examples of a sulfonate moiety with at least one electron withdrawing substituent in the α position of the sulfonate moiety. The groups —CH$_2$—SO$_3^-$, —CF$_2$—CH$_2$—SO$_3^-$, —CH$_2$—COO$^-$ and —CF2-CH2-(SO3NH2$^-$) are examples of a sulfonate, carboxylate or sulfamate anion respectively that do not contain an electron withdrawing group in the α position to the sulfonate, carboxylate or sulfamate moiety.

Acid Generators

As discussed above, in one preferred aspect, blends of two or more acid generators are provided wherein the acid generators upon exposure to activating radiation produce acids of differing pKa values and at least one acid generator comprises a covalently linked acid-labile moiety.

Suitable acid-labile groups of acid generators may be a variety of moieties, including acid-labile esters and acetals such as optionally substituted ethylcyclopentyl ester, methyladamantyl ester, ethyl adamantyl ester, t-butylester, phenyl ester, naphthyl ester and others. As referred to herein, acid-labile moieties or groups (including acid-labile esters and acetals) undergo reaction in the presence of generated acid (from an acid generator compound in a resist) during typical lithographic processing, including any post-radiation exposure thermal exposure. Acid-labile groups as referred to herein also may be referred to as photoacid-labile groups.

Preferred acid-labile groups of the present acid generators may comprise acid-labile ester moieties such as a group of the formula —C(=O)O(CH$_2$)n(C=O)O-ALG, where n is an integer of from 1 to 12, preferably n is 1, 2, 3 or 4, and ALG is a group (e.g. that provides a quaternary carbon linked to the ester) that results in an acid labile moiety, such as t-butyl or a ring system with linking quaternary carbon such as 1-ethylcyclopenyl or methyladamantyl.

In a particular aspect, an acid generator as disclosed herein may comprise an acid-labile ester linkage of the Formula (V):

wherein in Formula (V) R$^3$ is a non-hydrogen substituent that provides an acid-labile moiety such as a carbamate, an acid-labile ester or acetal group. For instance, exemplary preferred R$^3$ groups include t-butyl, or more preferably a further ester linkage such as where R$^3$ is —(CH$_2$)n(C=O)O-ALG, where n is an integer of from 1 to 12, preferably n is 1, 2, 3 or 4, and ALG is a group (e.g. that provides a quaternary carbon linked to the ester) that results in an acid labile moiety, such as t-butyl or a ring system with linking quaternary carbon such as 1-ethylcyclopentyl or methyladamantyl.

In another particular aspect, an acid generator as disclosed herein may comprise an acid-labile ester linkage of the Formula (VI):

wherein in Formula (VI) X and Y are independently hydrogen or a non-hydrogen substituent such as halogen (F, Cl, Br, I), C$_{1-10}$alkyl, C$_{1-10}$alkoxy; R$^3$ is a non-hydrogen substituent that provides an acid-labile moiety such as a carbamate, an acid-labile ester or acetal group; and n is a positive integer such as any of 1 through 20, more typically n is any of 1-10 or 1-4. Exemplary preferred R$^3$ groups include t-butyl, or more preferably a further ester linkage such as where R$^3$ is —(CH$_2$)n(C=O)O-ALG, where n is an integer of from 1 to 12, preferably n is 1, 2, 3 or 4, and ALG is a group (e.g. that provides a quaternary carbon linked to the ester) that results in an acid labile moiety, such as t-butyl or a ring system with linking quaternary carbon such as 1-ethylcyclopentyl or methyladamantyl.

Such ester-containing acid-labile groups (such as those of Formula V) or ether-containing acid-labile groups (such as those of Formula VI) can be a substituent at any various available positions of an acid generator. In certain preferred aspects, an ester-containing acid-labile group will be a ring substituent of a carbocyclic aryl group such as phenyl or multi-cyclic aromatic ring such as naphthyl or anthracenyl ring of an acid generator compound.

In certain aspects, an acid generator also may comprise multiple acid-labile groups, including multiple distinct acid-labile groups, including e.g. an acid generator that comprises at least one ester-containing acid-labile groups (such as those of Formula V) as well as at least one ether-containing acid-labile groups (such as those of Formula VI).

In the above Formulae (I), (II), (III), (IV), (V) and (VI), suitable non-hydrogen substituents may be e.g. non-hydrogen substituent such as halo (F, Cl, Br or I); cynano, nitro, hydroxy, optionally substituted C1-20alkyl, optionally substituted C1-20alkoxy, such as optionally substituted alkyl (e.g. optionally substituted C1-10 alkyl), optionally substituted alkenyl or alkynyl preferably having 2 to about 20 carbon atoms such as such as allyl; optionally substituted ketones preferably having 1 to about 20 carbon atoms; optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; optionally substituted carboxy preferably have 1 to about 20 carbon atoms (which includes groups such as —COOR' where R' is H or C1-8alkyl, including esters that are substantially non-reactive with photoacid); optionally substituted alkaryl such as optionally substituted benzyl, optionally substituted carbocyclic aryl such as optionally substituted phenyl, naphthyl, acenaphthyl, or optionally substituted heteroalicyclic or heteroaromatic group such as pyridyl, furanyl, pyrrole, thiophene, furan, imidazole, pyrazole, oxazole, isoxazole, thiazole, isothiazole, triazole, furanzan, oxadiazole, thiadiazole, dithiazole, terazole, pyran, thiopyran, diazine, oxazine, thiazine, dioxine, dithine, and triazine and polyaromatic groups containing one or more of such moieties.

As discussed above, acid generators (including acid generators of Formulae (I), (II), (III), (IV)) may comprise electron withdrawing moieties, which suitably may be e.g. halogen such as Cl, Br or F with F being preferred, C1-20haloalkyl with fluoroalkyl being preferred including perfluoralkyl; cyano; nitro; C1-20alkylsulfonyl, —COOH; and >C=O.

As discussed, various moieties of acid generators and other materials may be optionally substituted. A "substituted" substituent may be substituted at one or more available positions, typically 1, 2, or 3 positions by one or more suitable groups such as e.g. halogen (particularly F, Cl or Br); cyano; nitro; $C_{1-8}$ alkyl; $C_{1-8}$ alkoxy; $C_{1-8}$ alkylthio; $C_{1-8}$ alkylsulfonyl; $C_{2-8}$ alkenyl; $C_{2-8}$ alkynyl; hydroxyl; nitro; alkanoyl such as a $C_{1-6}$ alkanoyl e.g. acyl, haloalkyl particularly $C_{1-8}$ haloalkyl such as $CF_3$; —CONHR, —CONRR' where R and R' are optionally substituted $C_{1-8}$alkyl; —COOH, COC, >C=O; and the like.

Specifically preferred acid generator anions that can provide a stronger acid (e.g. pKa less than 1.0) include the following:

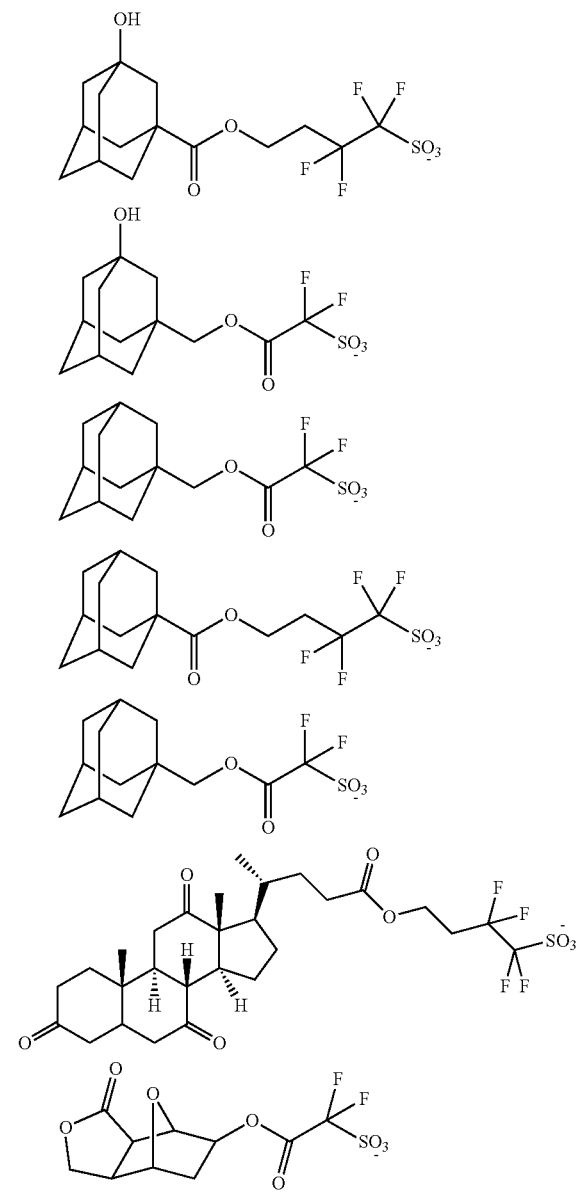

Specifically preferred acid generator anions that can provide a weaker acid (e.g. pKa of 1.0 or greater) include the following:

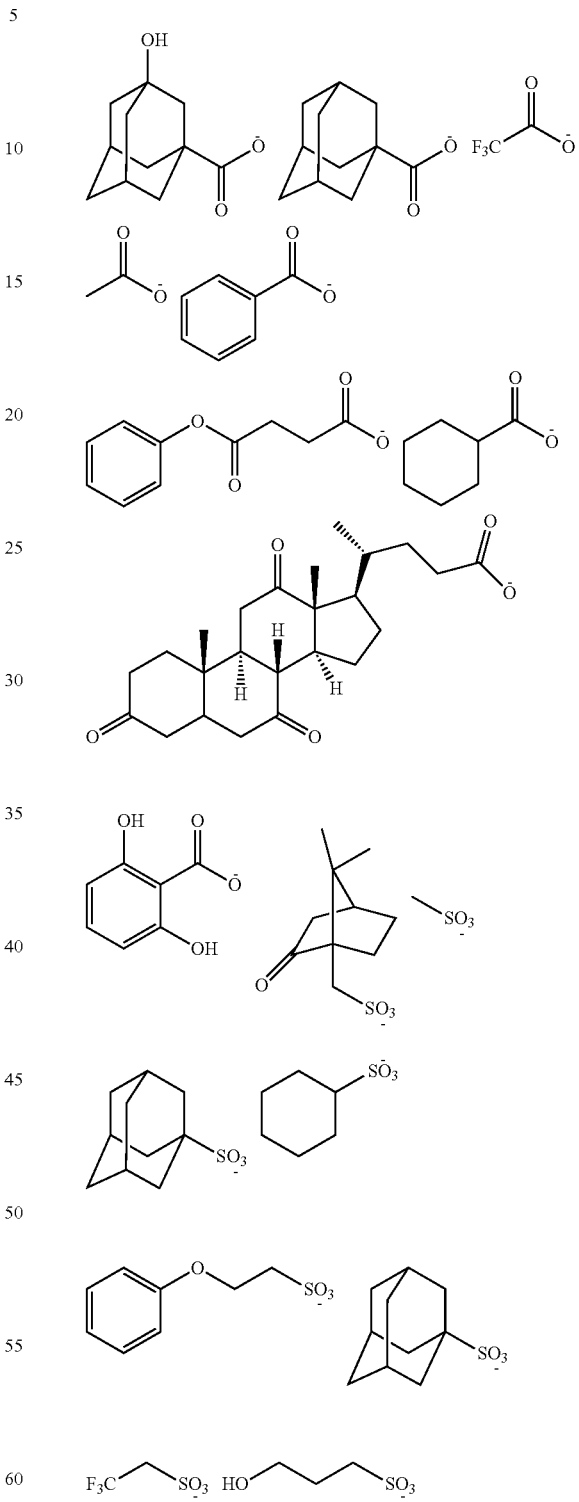

Specifically preferred acid generator structures for the counter cation of either the strong or weak acid generator anions as discussed and identified above include the following:

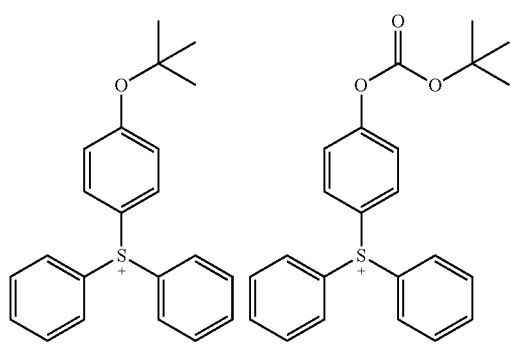
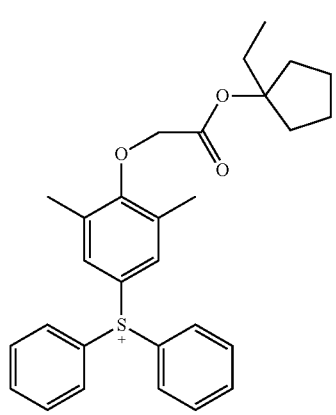
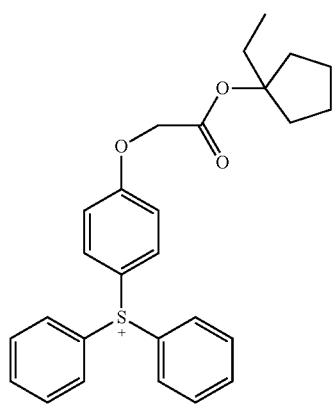
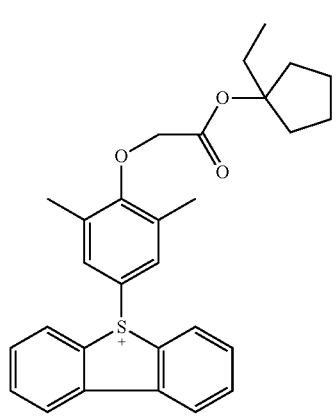
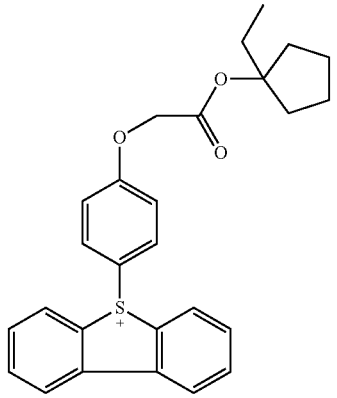
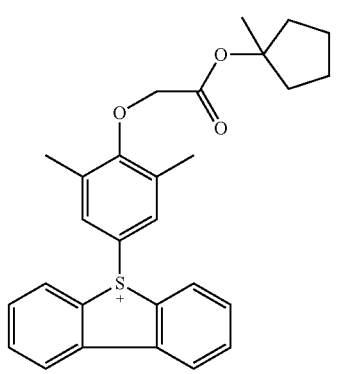
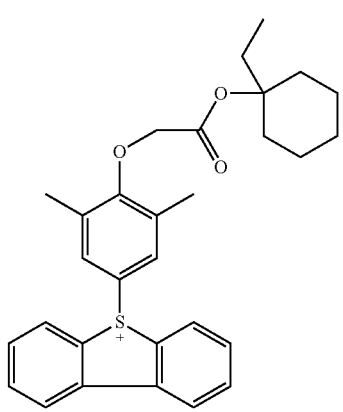
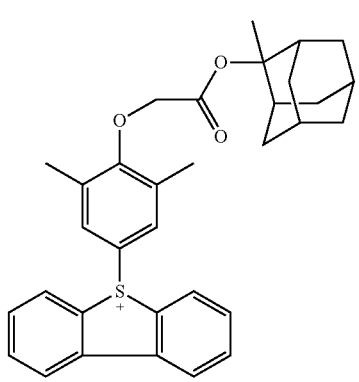

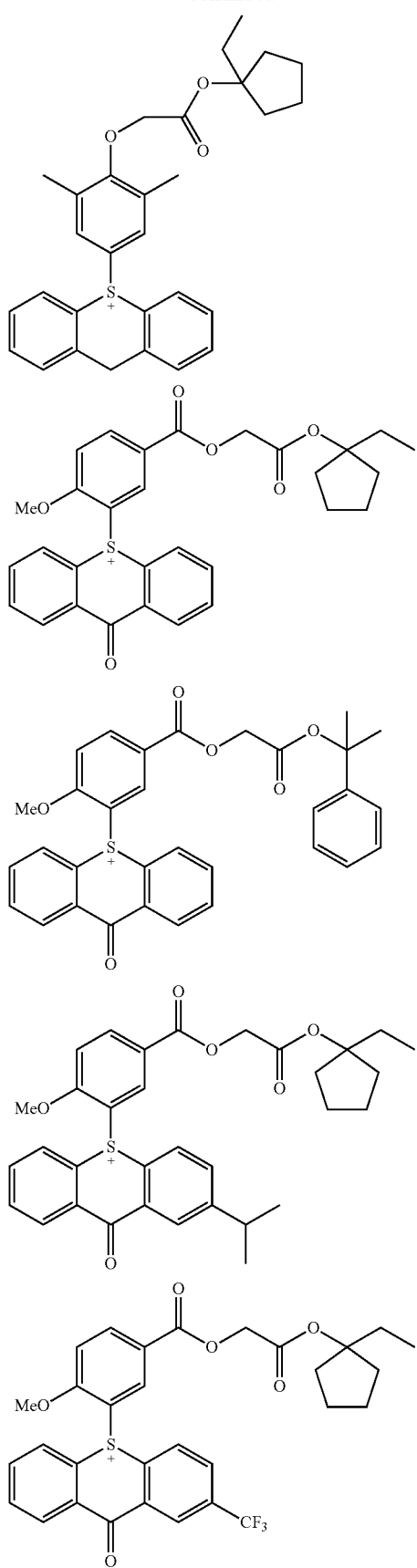
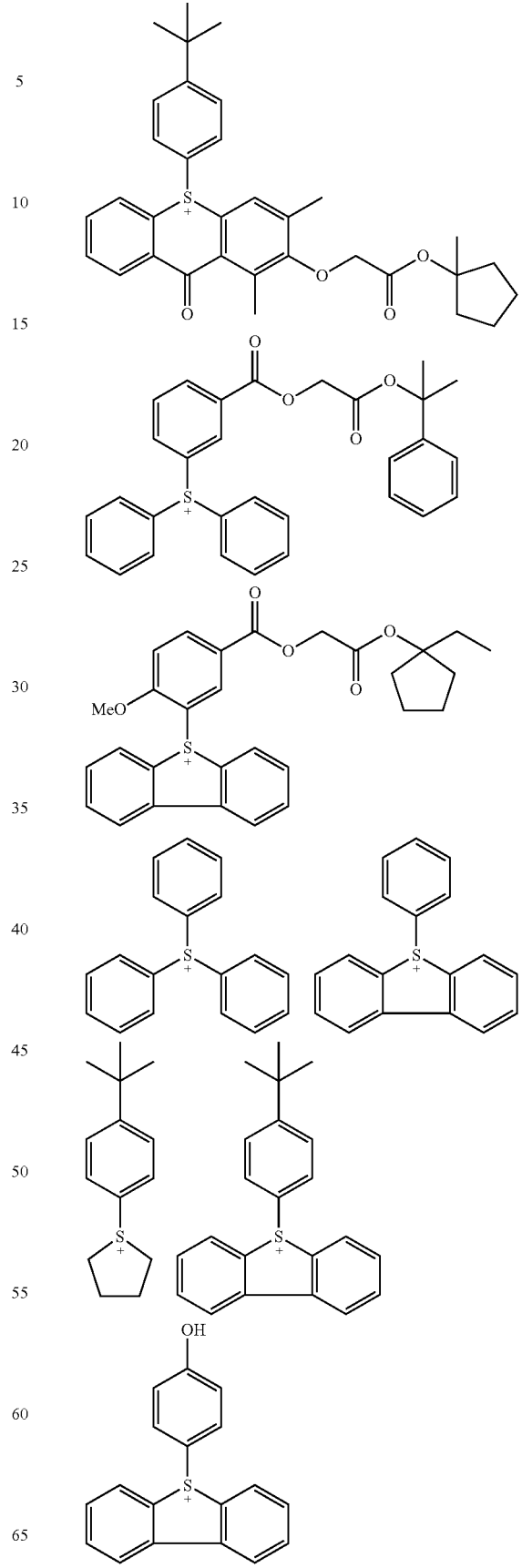

-continued

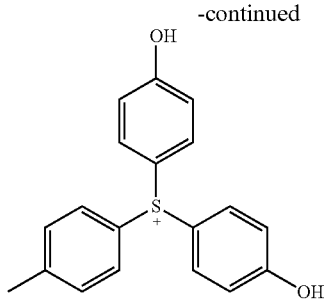
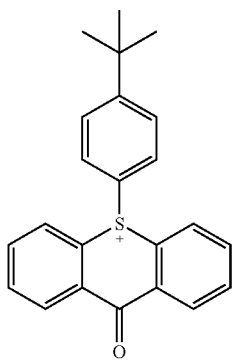
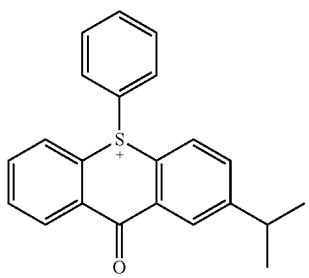
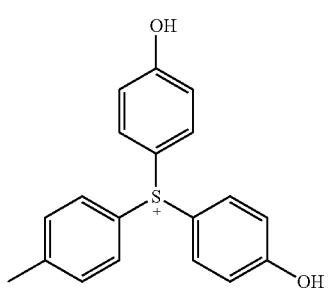
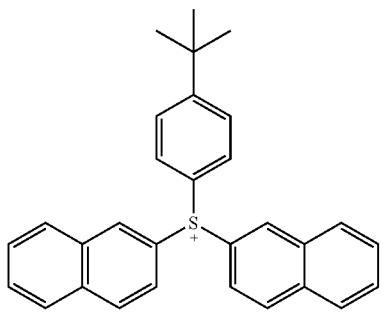

-continued

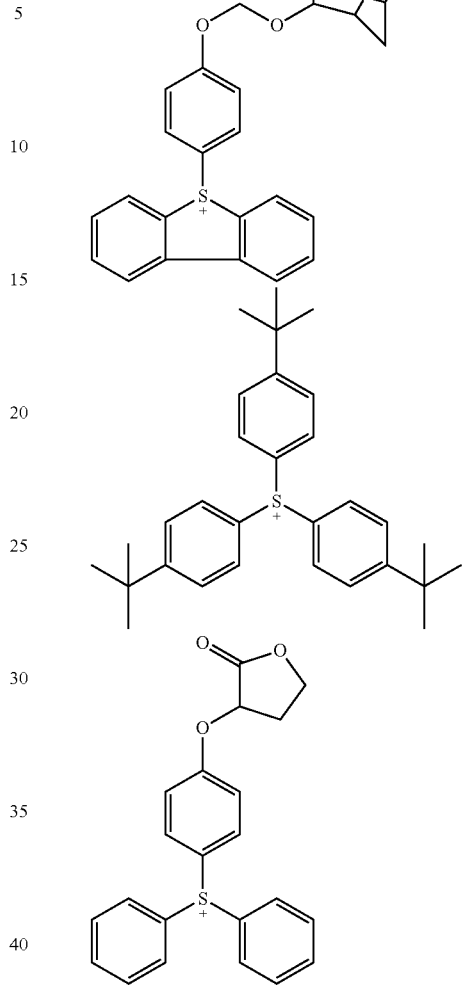

Acid generators of the invention can be readily prepared. Exemplary preferred syntheses are set forth in the examples which follow. Thus, for instance, dibenzothiophene oxide can be functionalized to provide a sulfonium salt, such as by reaction with a substituted phenyl reagent suitably in the presence of Eaton's reagent. The thus formed sulfonium salt can be further functionalized as desired, such as to provide one or more covalently linked acid-labile groups.

Photoresist Compositions

As discussed above, acid generators as disclosed herein are useful as the radiation sensitive component in photoresist compositions, including both positive-acting and negative-acting chemically amplified resist compositions.

The photoresists of the invention typically comprise a polymer and two or more acid generators as disclosed herein. Preferably the polymer has functional groups that impart alkaline aqueous developability to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-deprotectable monomer having the following formula (V), a lactone-containing monomer of the following formula (VI), a base-soluble monomer of the following formula (VII) for adjusting dissolution rate in alkaline developer, and a photoacid-generating monomer of the following formula (VIII), or a combination comprising at least one of the foregoing monomers:

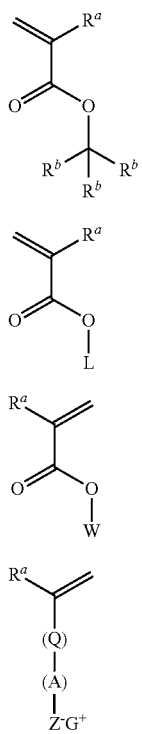

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the photoacid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, Z is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

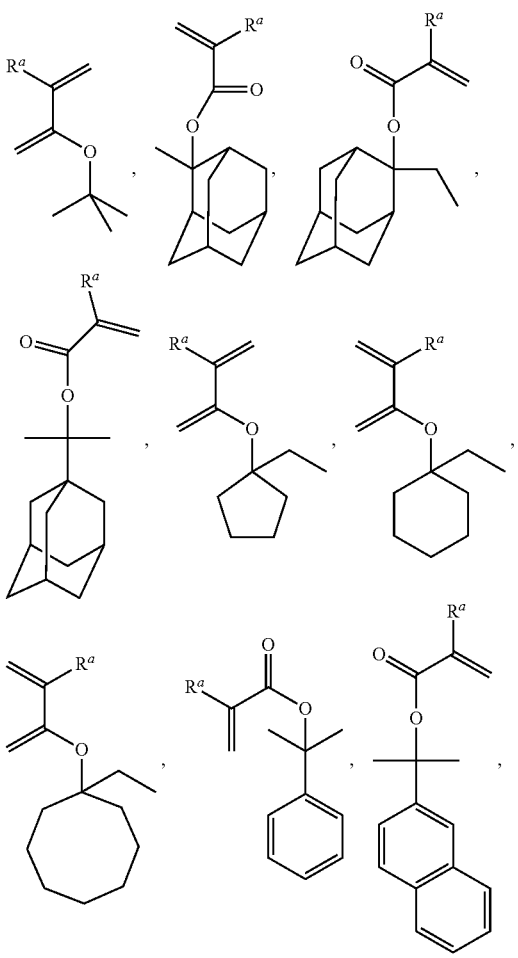

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

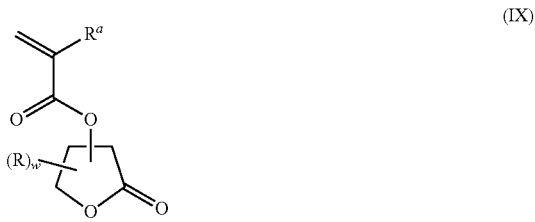

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

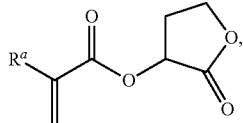

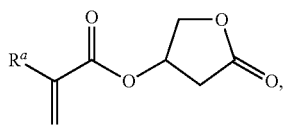

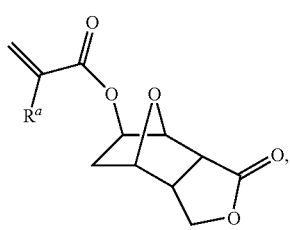

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

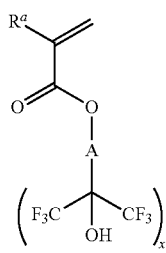

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

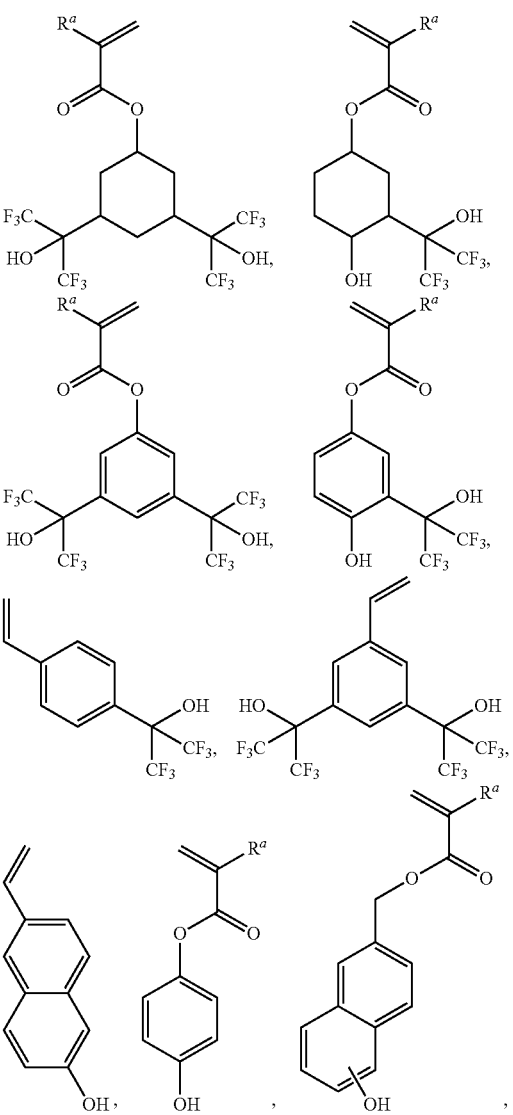

or a combination comprising at least one of the foregoing, wherein $R^a$ is H, F, —CN, $C_{1-6}$ alkyl, or $C_{1-6}$ fluoroalkyl.

Preferred photoacid generating monomer include those of the formulae (XI) or (XII):

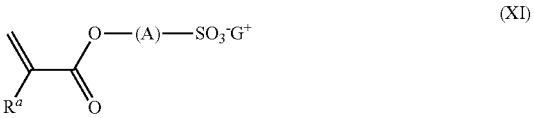

(XI)

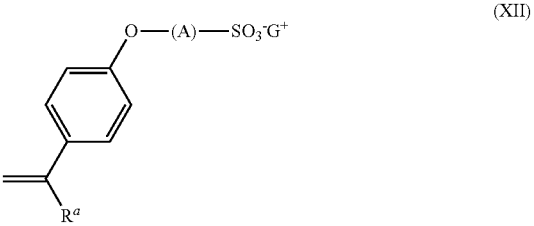

(XII)

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[$C(R^1)_2$)$_x$C(=O)O]$_b$—C(($R^2$)$_2$)$_y$(CF$_2$)$_z$— group, or an o-, m- or p-substituted —$C_6F_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred photoacid generating monomers include:

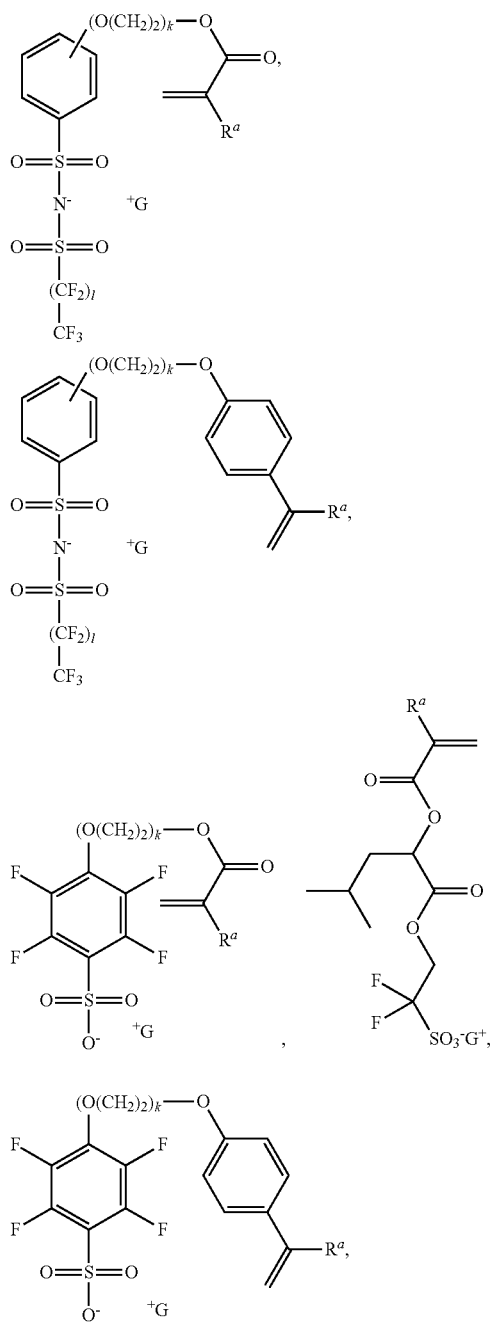

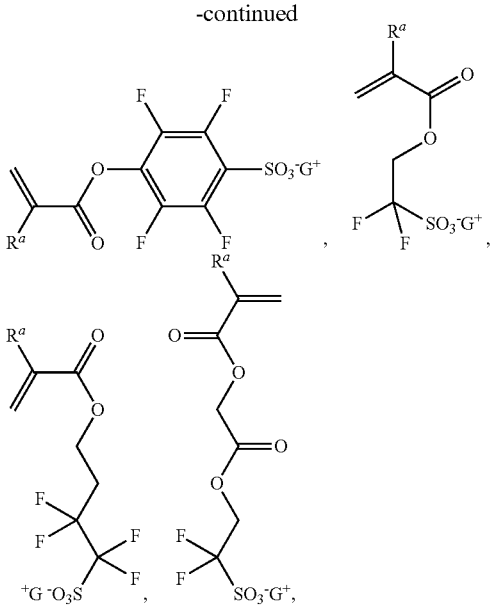

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation.

Preferred photoacid-generating monomers may include sulfonium or iodonium cation. Preferably, in formula (IV), $G^+$ is of the formula (XIII):

(XIII)

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

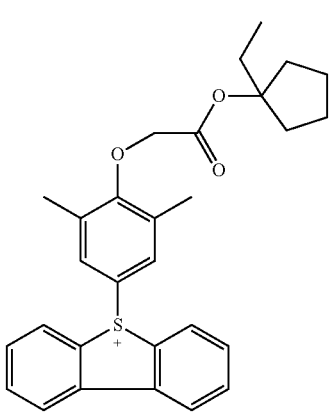

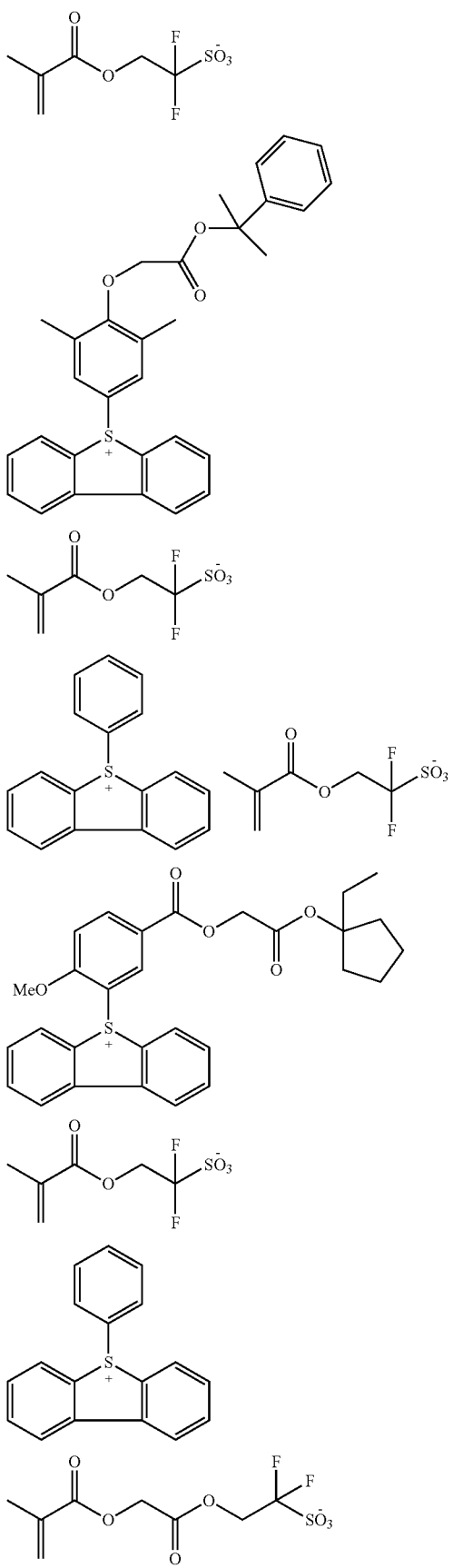
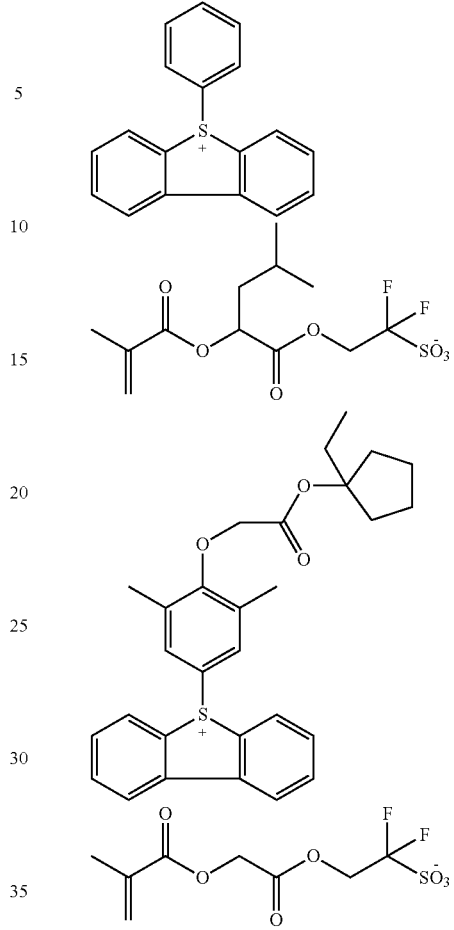

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Polymers for use in photoresists of the invention may suitably vary widely in molecular weight and polydisperity. Suitable polymers include those that have an $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more photoacid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis(2-hydroxypropyl)ethylenediamine; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Such photoresists may include the polymer in an amount of 50 to 99 wt %, specifically 55 to 95 wt %, more specifically 60 to 90 wt %, and still more specifically 65 to 90 based on the total weight of solids. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 50 wt %, specifically less than or equal to 35%, or more specifically less than or equal to 25%, based on the total weight of solids. The total solids content for the photoresist composition may be 0.5 to 50 wt %, specifically 1 to 45 wt %, more specifically 2 to 40 wt %, and still more specifically 5 to 30 wt %, based on the total weight of solids and solvent. The acid generators should be present in an amount sufficient to enable generation of a latent image in a coating layer of the resist. More specifically, the two or more acid generators will suitably be present in an amount of from about 1 to 50 weight percent of total solids of a resist. It will be understood that the solids includes polymer, quencher, surfactant, and any optional additives, exclusive of solvent.

A coated substrate may be formed from the photoresist containing acid generators which should be present in an amount sufficient to enable generation of a latent image in a coating layer of the resist and acid generators. Such a coated substrate includes: (a) a substrate having one or more layers to be patterned on a surface thereof; and (b) a layer of the photoresist composition including the acid generator compounds over the one or more layers to be patterned. For EUV or e-beam imaging, photoresists may suitably have relatively higher content of acid generator compounds, e.g. where the one or more acid generators comprise 5 to 10 to about 65 weight percent of total solids of the resist. Typically, lesser amounts of the photoactive component will be suitable for chemically amplified resists.

The photoresists of the invention are generally prepared following known procedures with the exception that one or more acid generator compounds of the invention are substituted for prior photoactive compounds used in the formulation of such photoresists. The photoresists of the invention can be used in accordance with known procedures.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOL strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including on a surface of the substrate; (b) patternwise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from about 500 to 3,000 rpm, and more preferably 1,000 to 2,500 rpm. The coated wafer is spun to remove solvent, and baked on a hot plate to remove residual solvent and free volume from the film to make it uniformly dense.

Patternwise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. A pattern forms by developing.

Additionally, for positive resists, unexposed regions can be selectively removed by treatment with a suitable nonpolar solvent for negative tone development. See U.S. 2011/0294069 for suitable procedures for negative tone development of positive photoresists. Typical nonpolar solvents for negative tone development are organic developers, such as a solvent chosen from ketones, esters, hydrocarbons, and mixtures thereof, e.g. acetone, 2-hexanone, methyl acetate, butyl acetate, and tetrahydrofuran.

The photoresist may, when used in one or more such a pattern-forming processes, be used to fabricate electronic and optoelectronic devices such as memory devices, processor chips (CPU's), graphics chips, and other such devices.

E-size and exposure latitude % (EL %) were calculated from critical dimension (CD) data through dose and focus (FEM) with 10% CD boundaries restricted to 100 nm depth of focus (DoF). For tables 4 and 5, CDU was calculated using 9 FOV(Fields of View) measured around best focus and best energy, with 20 CH measured/FOV. For tables 2, 3 and 6 FOV CDU is the calculated 3 Sigma for 10 FOV measuring 36 CH for each FOV, all taken within Best Exposure/Best Focus.

Example 1: Preparation of Camphorsulfonate Silver Salt

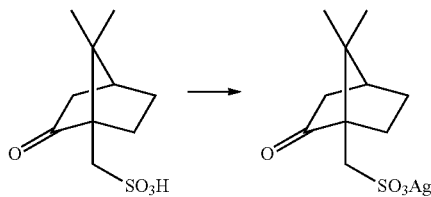

Silver oxide (2.74 g, 11.8 mmol) was added to a solution of camphorsulfonic acid (5.00 g, 21.5 mmol), in acetonitrile (50 mL), stirred at r.t. overnight, filtered and concentrated to afford the title compound (7.00 g, 95%) as a white solid. $^1$H NMR (300 MHz, (CD$_3$)$_2$SO) δ: 2.94 (d, J=14.6 Hz, 1H), 2.60-2.72 (m, 1H), 2.43 (d, J=14.6 Hz, 1H), 2.25 (dt, J=14.6, 3.6 Hz, 1H), 1.96 (t, J=4.5 Hz, 1H), 1.76-1.91 (m, 2H), 1.25-1.37 (m, 2H), 1.06 (s, 3H), 0.76 (s, 3H).

Example 2: Preparation of 3-hydroxyadamantanecarboxylic acid silver salt

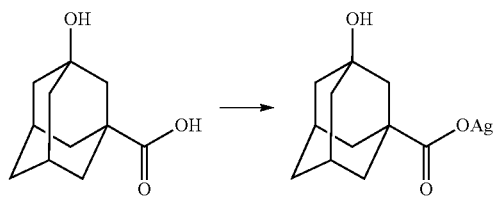

Silver oxide (5.79 g, 49.8 mmol) was added to a solution of 3-hydroxyadamantanecarboxylic acid (10.0 g, 51 mmol) in acetone (250 mL) and water (250 mL) and stirred at r.t. overnight. The precipitate was filtered, washed with 1:1 acetone:water (3×250 mL), MTBE (3×200 mL) and dried to afford the title compound (13.2 g, 86%) as an off white sold. $^1$H NMR (300 MHz, (CD$_3$)$_2$SO) δ: 4.36 (s, 1H), 2.50-2.54 (m, 2H), 1.20-1.78 (m, 12H).

Example 3: Preparation of 5-(4-(2-(1-ethylcyclopentyloxy)-2-oxoethoxy)-3,5-dimethylphenyl)-5H-dibenzo[b,d]thiophenium camphorsulfonate

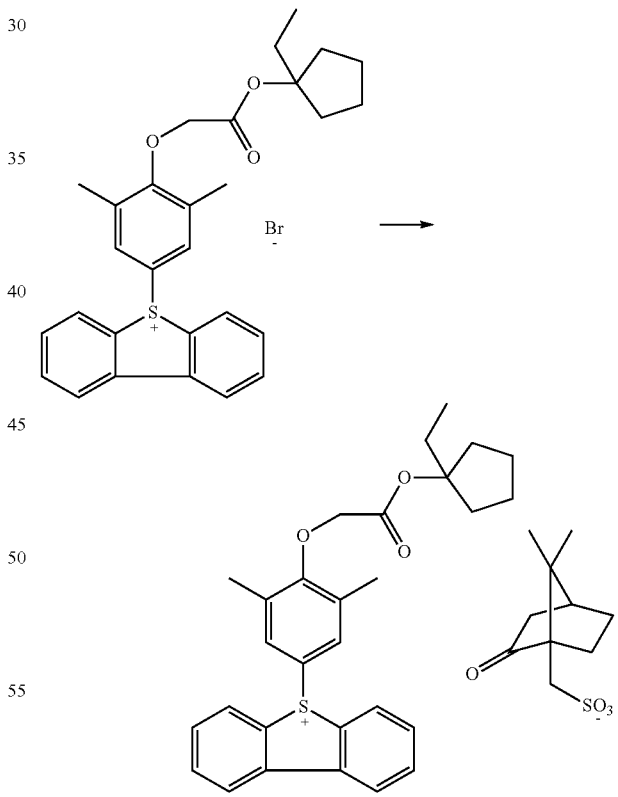

Camphorsulfonate silver salt (2.84 g, 8.34 mmol) in methanol (50 mL) and water (5 mL) was added to a solution of 5-(4-(2-(1-ethylcyclopentyloxy)-2-oxoethoxy)-3,5-dimethylphenyl)-5H-dibenzo[b,d]thiophenium bromide in methanol (100 mL) and stirred at r.t. overnight. The reaction mixture was filtered, concentrated, diluted with dichloromethane (200 mL) and washed with water (3×200 mL)

and concentrated to afford the title compound (4.4 g, 76%) as a white solid. $^1$H NMR (300 MHz, (CD$_3$)$_2$CO) δ: 8.87-8.55 (m, 4H), 7.96 (dt, J=7.5, 0.5 Hz, 2H), 7.74 (dt, J=7.5, 0.5 Hz, 2H), 7.59 (s, 2H), 4.53 (s, 2H), 3.13 (d, J=15.5 Hz, 1H), 3.00-3.09 (m, 1H), 2.61 (d, J=15 Hz, 1H), 2.28 (s, 6H), 1.90-2.12 (m, 7H), 1.76 (d, J=15 Hz, 1H), 1.55-1.72 (m, 6H), 1.35-1.43 (m, 1H), 1.23-1.33 (m, 1H), 1.22 (s, 3H), 1.12 (s, 3H), 0.84 (t, J=7.5 Hz, 3H).

Example 4: Preparation of 5-(4-(2-(1-ethylcyclopentyloxy)-2-oxoethoxy)-3,5-dimethylphenyl)-5H-dibenzo[b,d]thiophenium 3-hydroxyadamantanecarboxylate

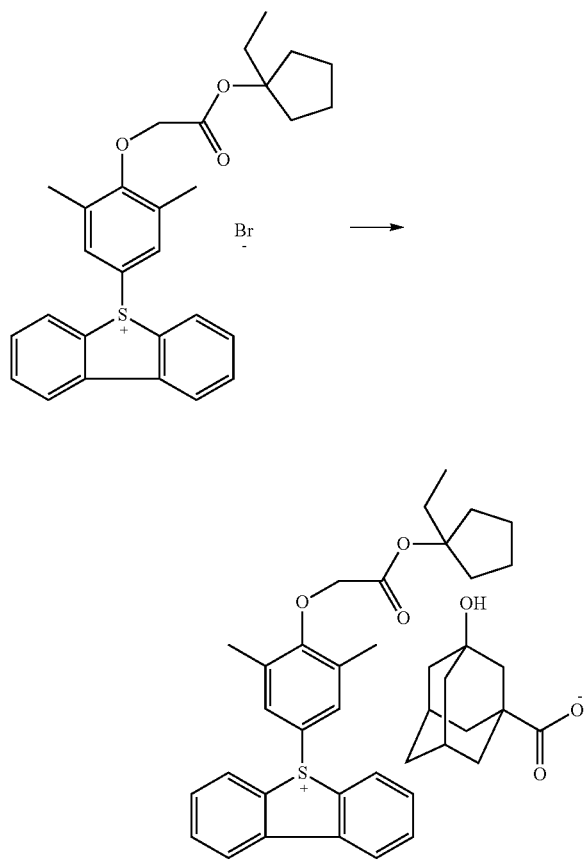

5-(4-(2-(1-ethylcyclopentyloxy)-2-oxoethoxy)-3,5-dimethylphenyl)-5H-dibenzo[b,d]thiophenium bromide (14.283 g, 26.47 mmol) in methanol (250 mL) was added to a heterogeneous solution of 3-hydroxyadamantanecarboxylic acid silver salt (8.024 g, 26.47 mmol) in methanol (250 mL) and water (62.5 mL) and stirred at r.t. overnight. The reaction mixture was filtered, concentrated and dried in vaccuo at 50° C. to afford the title compound (16.9 g, 98%) as a white solid. $^1$H NMR (300 MHz, (CD$_3$)$_2$SO) δ: 8.52 (d, J=8 Hz, 2H), 8.36 (d, J=8.5 Hz, 2H), 7.96 (t, J=7.5 Hz, 2H), 7.76 (t, J=7.5 Hz, 2H), 7.33 (s, 2H), 4.52 (s, 2H), 4.0-4.2 (brs, 10H), 2.49-2.55 (m, 2H), 2.22 (s, 6H), 1.90-2.04 (m, 6H), 1.37-1.79 (m, 18H), 0.80 (t, 7 Hz, 3H).

Example 5: Preparation of 10-(5-((2-(1-ethylcyclopentyloxy)-2-oxoethoxy)carbonyl)-2-methoxyphenyl)-9-oxo-9,10-dihydrothioxanthylium camphorsulfonate

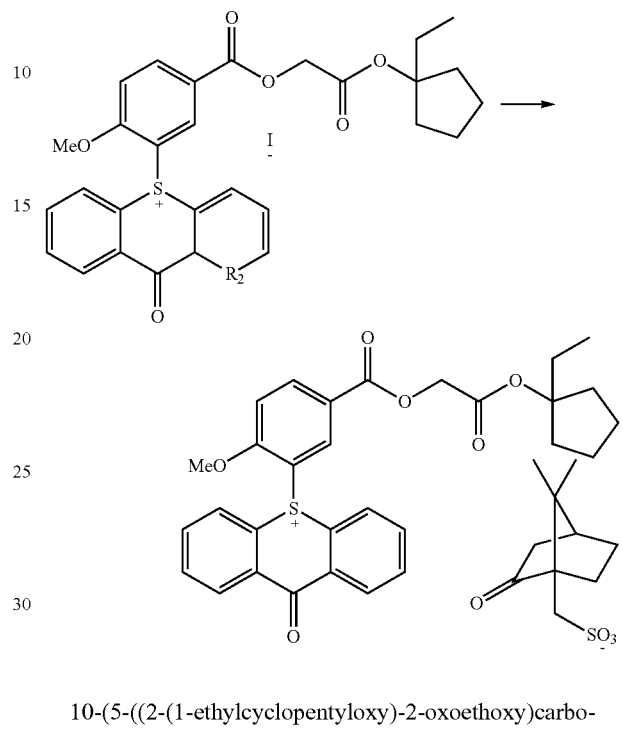

10-(5-((2-(1-ethylcyclopentyloxy)-2-oxoethoxy)carbonyl)-2-methoxyphenyl)-9-oxo-9,10-dihydrothioxanthylium iodide (0.500 g, 0.773 mmol) and camphorsulfonate silver salt (0.262 g, 0.773 mmol) were dissolved in methanol (20 mL) and starred at r.t. overnight. The reaction mixture was filtered and concentrated to afford the title compound (0.581 g, 76%) as a white solid. $^1$H NMR (300 MHz, (CD$_3$)$_2$CO) δ: 9.04 (d, J=1.8 Hz, 1H), 8.65 (dd, J=9.3, 1.8 Hz, 1H), 8.37-8.49 (m, 3H), 8.02-8.15 (m, 4H), 7.46 (d, J=9.0 Hz, 1H), 4.87 (s, 2H, 3.41 (s, 3H), 2.89-3.08 (m, 2H), 2.48 (d, J=14.8 Hz, 1H), 1.95-2.28 (m, 8H), 1.56-1.80 (m, 6H), 1.20-1.33 (m, 1H), 1.17 (s, 3H), 1.13 (s, 3H), 0.92 (t, J=6.9 Hz, 3H).

Example 6: Preparation of 10-(5-((2-(1-ethylcyclopentyloxy)-2-oxoethoxy)carbonyl)-2-methoxyphenyl)-9-oxo-2-(trifluoromethyl)-9,10-dihydrothioxanthylium camphorsulfonate

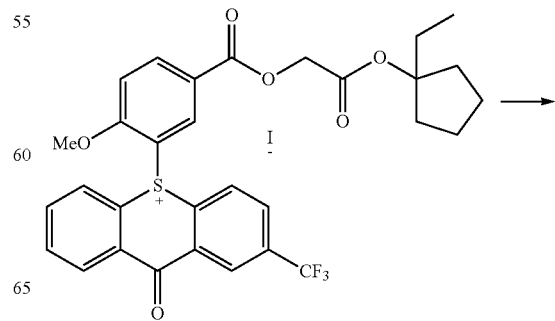

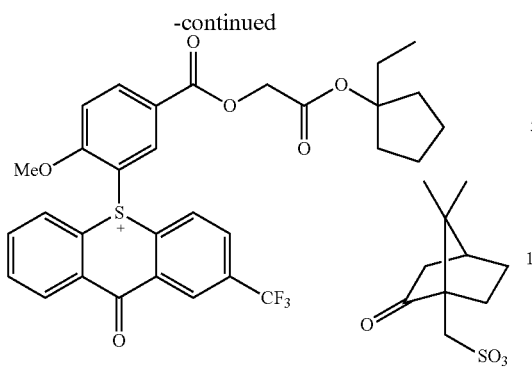

(((1S,4S)-7,7-dimethyl-2-oxobicyclo[2.2.1]heptan-1-yl)methylsulfonyloxy)silver (0.0171 g, 0.00503 mmol) was added to a solution of 10-(5-((2-(1-ethylcyclopentyloxy)-2-oxoethoxy)carbonyl)-2-methoxyphenyl)-9-oxo-2-(trifluoromethyl)-9,10-dihydrothioxanthylium iodide (0.0360 g, 0.00503 mmol) in methanol (3 mL) and stirred at r.t. for 5 h. The reaction mixture was filtered and concentrated to afford the title compound (0.033 g, 80%) as an orange solid. $^1$H NMR (300 MHz, (CD$_3$)$_2$CO) δ: 9.19 (vis s, 1H), 8.84 (vis s, 1H), 8.52-8.77 (m, 2H), 8.49 (d, J=8.7 Hz, 1H), 8.32-8.45 (m, 2H), 8.02-8.28 (m, 2H), 7.45 (d, J=8.7 Hz, 1H), 4.89 (s, 2H), 3.67 (s, 3H), 2.89-3.08 (m, 2H), 2.42 (d, J=14.8 Hz, 1H), 1.95-2.28 (m, 8H), 1.56-1.80 (m, 6H), 1.20-1.33 (m, 1H), 1.17 (s, 3H), 1.13 (s, 3H), 0.96 (t, J=6.9 Hz, 3H).

Example 7: Preparation of 5-phenyl-5H-dibenzo[b,d]thiophenium 3-hydroxyadamantanecarboxylate

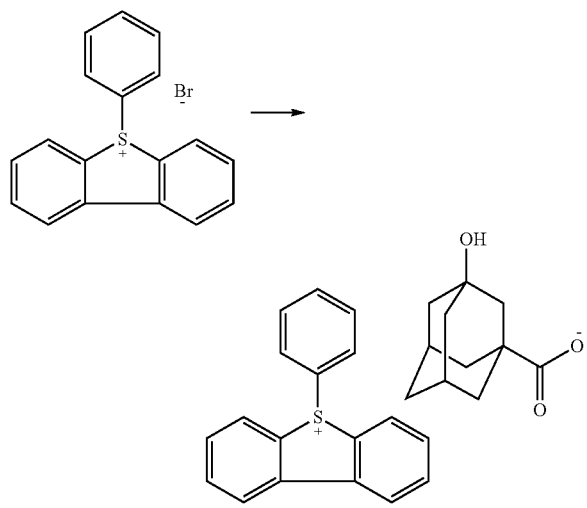

5-phenyl-5H-dibenzo[b,d]thiophenium bromide (4.00 g, 11.7 mmol) in methanol (50 mL) was added to a heterogeneous solution of 3-hydroxyadamantanecarboxylic acid silver salt (3.55 g, 11.7 mmol) in methanol (50 mL) and water (12.5 mL) and stirred at r.t. overnight. The reaction mixture was filtered, concentrated, and precipitated from methyl tert-butyl ether to afford the title compound (4.91 g, 91%) as a white solid. $^1$H NMR (300 MHz, (CD$_3$)$_2$SO) δ: 8.53 (d, J=7.5 Hz, 2H), 8.43 (d, J=8 Hz, 2H), 7.96 (t, J=7 Hz, 2H), 7.76 (t, J=8 Hz, 2H), 7.54-7.79 (m, 5H), 2.48-2.55 (brs, 10H), 1.46-2.05 (m, 2H), 1.33-1.56 (m, 12H).

Example 8: Preparation of 5-phenyl-5H-dibenzo[b,d]thiophenium ((1S,4S)-7,7-dimethyl-2-oxobicyclo[2.2.1]heptan-1-yl)methanesulfonate

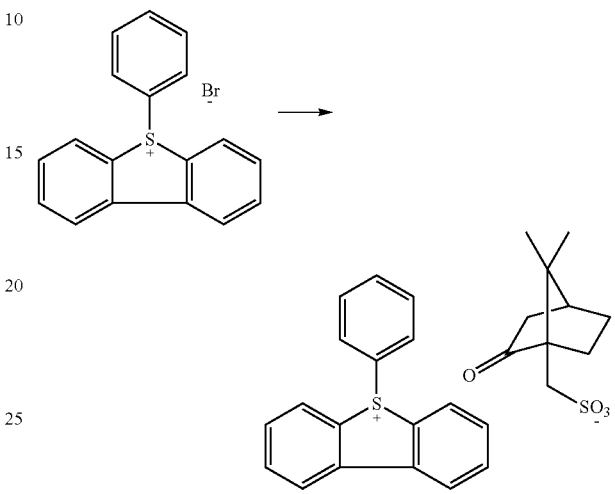

5-phenyl-5H-dibenzo[b,d]thiophenium bromide (2.00 g, 5.86 mmol) and (((1S,4S)-7,7-dimethyl-2-oxobicyclo[2.2.1]heptan-1-yl)methylsulfonyloxy)silver (1.99 g, 5.86 mmol) were dissolved in methanol (30 mL) and water (1 mL) and stirred at r.t. overnight. The reaction mixture was filtered and concentrated to afford the title compound (2.87 g, 99%) as a white solid. $^1$H NMR (300 MHz, (CD$_3$)$_2$SO) δ: 8.52 (d, J=7.5 Hz, 2H), 8.38 (d, J=7.5 Hz, 2H), 7.96 (t, J=7 Hz, 2H), 7.76 (t, J=7.5 Hz, 2H), 7.70 (t, J=7.5 Hz, 1H), 7.56-7.67 (m, 4H), 2.85 (d, J=14.5 Hz, 1H), 2.65-2.77 (m, 1H), 2.35 (d, J=15 Hz, 1H), 2.19-2.28 (m, 1H), 1.78-1.88 (m, 3H), 1.26 (m, 2H), 1.05 (s, 3H), 0.74 (s, 3H).

Example 9: Preparation of Polymer with Acid Generator Units

Heel solution was made by dissolving 2-phenylpropan-2-yl methacrylate (0.39 g), 2-oxotetrahydrofuran-3-yl methacrylate (0.33 g), 3,5-bis(1,1,1,3,3,3-hexafluoro-2-hydroxypropan-2-yl)cyclohexyl methacrylate (0.57 g) and 5-(4-(2-(1-ethylcyclopentyloxy)-2-oxoethoxy)-3,5-dimethylphenyl)-5H-dibenzo[b,d]thiophenium 1,1-difluoro-2-(methacryloyloxy)ethanesulfonate (0.31 g) in 12.81 g acetonitrile/tetrahydrofuran (2/1 v/v). Feed solution was prepared by dissolving 2-phenylpropan-2-yl methacrylate (185.54 g, 0.967 mol), 2-oxotetrahydrofuran-3-ylmethacrylate (204.27 g, 1.26 mol), 3,5-bis(1,1,1,3,3,3-hexafluoro-2-hydroxypropan-2-yl)cyclohexyl methacrylate (127.98 g, 0.29 mol) and 5-(4-(2-(1-ethylcyclopentyloxy)-2-oxoethoxy)-3,5-dimethylphenyl)-5H-dibenzo[b,d]thiophenium 1,1-difluoro-2-(methacryloyloxy)ethanesulfonate (81.5 g, 0.132 mol) in 606 g ethyl lactate:γ-butryl lactone (30/70 v/v). Initiator solution was prepared by dissolving 65.96 g initiator (V-65) in 66 g acetonitrile/tetrahydrofuran (2/1 v/v). The polymerization was carried out in a 2 L 3-neck round bottom flask fitted with a water condenser and a thermometer to monitor the reaction in the flask. The contents were stirred using an overhead stirrer. The reactor was charged with the heel solution and the contents were heated to 75° C. The feed solution and the initiator solution were fed into the reactor using syringe pump over a 4 hour time period. The contents were then stirred for additional 2 hours, whereby, the reaction was quenched using hydroquinone (2.0 g). The contents were cooled to room temperature and precipitated twice out of 10× (by weight) IPE/MeOH 95/5 (w/w). The polymer obtained was dried in vacuuo after each precipitation step at 50° C. for 24 hours to yield 500 g polymer.

Example 10: Further Preparation of Polymer with Acid Generator Units

The same process used for Example 9 was used in the preparation of polymer, except 5-phenyl-5H-dibenzo[b,d]thiophenium 1,1-difluoro-2-(methacryloyloxy)ethanesulfonate was used in place of 5-(4-(2-(1-ethylcyclopentyloxy)-2-oxoethoxy)-3,5-dimethylphenyl)-5H-dibenzo[b,d]thiophenium 1,1-difluoro-2-(methacryloyloxy)ethanesulfonate.

Example 11: Further Preparation and Processing of Photoresist Composition

A positive-tone photoresist composition was prepared by combining 55.432 g of a 10 wt % solution of the polymer from Example 9 in ethyl lactate, 94.235 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 13.304 g of a 0.5 wt % solution of tetrakis(2-hydroxypropyl)ethylenediamine in ethyl lactate, 1.109 g of a 0.5 wt % solution of fluorinated surfactant (Omnova PF656) in ethyl lactate, 48.170 g of ethyl lactate and 87.750 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 12: Further Preparation and Processing of Photoresist Composition

A positive-tone photoresist composition was prepared by combining 8.050 g of a 10 wt % solution of the polymer from Example 10 in ethyl lactate, 9.404 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 1.225 g of a 0.5 wt % solution of tetrakis(2-hydroxypropyl)ethylenediamine in ethyl lactate, 0.161 g of a 0.5 wt % solution of fluorinated surfactant (Omnova PF656) in ethyl lactate, 9.460 g of ethyl lactate and 11.70 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 13: Further Preparation and Processing of Photoresist Composition

A positive-tone photoresist composition was prepared by combining 7.615 g of a 10 wt % solution of the polymer from Example 10 in ethyl lactate, 11.013 g of a 2 wt % solution of the acid generator 5-(4-(2-(1-ethylcyclopentyloxy)-2-oxoethoxy)-3,5-dimethylphenyl)-5H-dibenzo[b,d]thiophenium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate in ethyl lactate, 0.892 g of a 0.5 wt % solution of tetrakis(2-hydroxypropyl)ethylenediamine in ethyl lactate, 0.651 g of a 2 wt % solution of compound of example 4 in ethyl lactate, 0.152 g of a 0.5 wt % solution of fluorinated surfactant (Omnova PF656) in ethyl lactate, 7.976 g of ethyl lactate and 11.700 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 14: Further Preparation and Processing of Photoresist Composition

A positive-tone photoresist composition was prepared by combining 7.952 g of a 10 wt % solution of the polymer from Example 10 in ethyl lactate, 9.289 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 0.932 g of a 0.5 wt % solution of tetrakis(2-hydroxypropyl)ethylenediamine in ethyl lactate, 0.680 g of a 2 wt % solution of the compound of example 4 in ethyl lactate, 0.159 g of a 0.5 wt % solution of fluorinated surfactant (Omnova PF656) in ethyl lactate, 9.287 g of ethyl lactate and 11.700 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 15: Further Preparation and Processing of Photoresist Composition

A positive-tone photoresist composition was prepared by combining 7.906 g of a 10 wt % solution of the polymer from Example 10 in ethyl lactate, 9.235 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 1.195 g of a 2 wt % solution of the compound of example 4 in ethyl lactate, 0.158 g of a 0.5 wt % solution of fluorinated surfactant (Omnova PF656) in ethyl lactate, 9.805 g of ethyl lactate and 11.70 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

For Tables 1-3 below, LWR, Esize, CDU, CER and EL % are all evaluated in the following way: Comparative Examples are normalized to 1 and consequently designated with "◊"; good metrics, those which represents at least a 10% improvement relative to the respective comparative, are designated with " "; improved metrics, those which represents between 0% and 10% improvement relative to the respective comparative, are designated with "▲" and underperformance is marked with "o". For Tables 4-5, there are multiple comparative examples for the comparison of one experimental data set. The experimental data set is normalized to 1 and consequently designated with "◇". Comparative examples which outperform the experimental data are designated with "▶" while data that underperform by at least 10% are designated with "□" and data that underperform by 0-10% are designated with "■".

The data in Table 6 represents a comparison of the differences between using Examples 3 and 8 as quenchers. Example 14 is normalized to 1 and Example 26 is referenced to 14 to show the similarity in performance.

TABLE 1

28 and 24 nm LS data. Normalized numbers below 1 indicate an improvement over the comparative.

| Example | LWR @ 28 nm 1:1 hp L/S | LWR @ 24 nm 1:1 hp L/S |
| --- | --- | --- |
| Example 10 (comparative) | ◇ | ◇ |
| Example 11 | | |
| Example 12 | | |
| Example 13 | | ▲ |

TABLE 2

30 nm CH data. Normalized numbers below 1 indicate an improvement over the comparative for Esize, DCU and ECR. Normalized numbers over 1 indicate an improvement over the comparative for EL

| Example | 30 nm Esize (mJ) | CDU (nm) | CER (nm) | EL % |
| --- | --- | --- | --- | --- |
| Example 11 (comparative) | ◇ | ◇ | ◇ | ◇ |
| Example 13 | | ▲ | ▲ | |
| Example 14 | | ▲ | ▲ | |
| Example 15 | | ▲ | ▲ | |

Example 16: Further Preparation and Processing of Photoresist Composition

A positive-tone photoresist composition was prepared by combining 8.044 g of a 10 wt % solution of the polymer from Example 10 in ethyl lactate, 9.506 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 0.943 g of a 0.5 wt % solution of tetrakis(2-hydroxypropyl)ethylenediamine in ethyl lactate, 0.161 g of a 0.5 wt % solution of fluorinated surfactant (Omnova PF656) in ethyl lactate, 9.647 g of ethyl lactate and 11.70 g of 2-hydroxyisobutyric acid methyl ester. The formulated resist was passed through a 0.01 µm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 17: Further Preparation and Processing of Photoresist Composition

A positive-tone photoresist composition was prepared by combining 7.940 g of a 10 wt % solution of the polymer from Example 9 in ethyl lactate, 9.383 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 0.818 g of a 0.5 wt % solution of tetrakis(2-hydroxypropyl)ethylenediamine in ethyl lactate, 0.675 g of a 2 wt % solution of the compound of example 4 in ethyl lactate, 0.159 g of a 0.5 wt % solution of fluorinated surfactant (Omnova PF656) in ethyl lactate, 9.326 g of ethyl lactate and 11.70 g of 2-hydroxyisobutyric acid methyl ester. The formulated resist was passed through a 0.01 µm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 18: Further Preparation and Processing of Photoresist Composition

A positive-tone photoresist composition was prepared by combining 7.829 g of a 10 wt % solution of the polymer from Example 9 in ethyl lactate, 9.252 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 1.566 g of a 2 wt % solution of the compound of example 4 in ethyl lactate, 0.157 g of a 0.5 wt % solution of fluorinated surfactant (Omnova PF656) in ethyl lactate, 9.497 g of ethyl lactate and 11.70 g of 2-hydroxyisobutyric acid methyl ester. The formulated resist was passed through a 0.01 µm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

TABLE 3

30 nm CH data. Normalized numbers below 1 indicate an improvement over the comparative for DCU and ECR. Normalized numbers over 1 indicate an improvement over the comparative for EL %

| Example | 30 nm CDU (nm) | 30 nm CER (nm) | 30 nm EL % |
| --- | --- | --- | --- |
| Example 16 (comparative) | ◇ | ◇ | ◇ |
| Example 17 | ▲ | ▲ | ▲ |
| Example 18 | o | ▲ | |

Example 19: Further Preparation and Processing of Photoresist Composition

A positive-tone photoresist composition was prepared by combining 7.976 g of a 10 wt % solution of the polymer from Example 9 in ethyl lactate, 9.947 g of a 2 wt % solution of the acid generator 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate in ethyl lactate, 0.538 g of a 0.5 wt % solution of tetrakis(2-hydroxypropyl)ethylenediamine in ethyl lactate, 0.160 g of a 0.5 wt % solution of fluorinated surfactant (Omnova PF656) in ethyl lactate, 9.680 g of ethyl lactate and 11.70 g of 2-hydroxyisobutyric acid methyl ester. The formulated resist was passed through a 0.01 µm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 20: Further Preparation and Processing of Photoresist Composition

A positive-tone photoresist composition was prepared by combining 7.975 g of a 10 wt % solution of the polymer from Example 10 in ethyl lactate, 9.947 g of a 2 wt % solution of the acid generator 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate in ethyl lactate, 0.552 g of a 0.5 wt % solution of tetrakis(2-hydroxypropyl)ethylenediamine in ethyl lactate, 0.160 g of a 0.5 wt % solution of fluorinated surfactant (Omnova PF656) in ethyl lactate, 9.667 g of ethyl lactate and 11.70 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 21: Further Preparation and Processing of Photoresist Composition

A positive-tone photoresist composition was prepared by combining 7.779 g of a 10 wt % solution of the polymer from Example 9 in ethyl lactate, 10.930 g of a 2 wt % solution of the acid generator 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate in ethyl lactate, 0.538 g of a 0.5 wt % solution of tetrakis(2-hydroxypropyl)ethylenediamine in ethyl lactate, 0.156 g of a 0.5 wt % solution of fluorinated surfactant (Omnova PF656) in ethyl lactate, 8.897 g of ethyl lactate and 11.70 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 22: Further Preparation and Processing of Photoresist Composition

A positive-tone photoresist composition was prepared by combining 8.176 g of a 10 wt % solution of the polymer from Example 9 in ethyl lactate, 8.953 g of a 2 wt % solution of the acid generator 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate in ethyl lactate, 0.497 g of a 0.5 wt % solution of tetrakis(2-hydroxypropyl)ethylenediamine in ethyl lactate, 0.164 g of a 0.5 wt % solution of fluorinated surfactant (Omnova PF656) in ethyl lactate, 10.510 g of ethyl lactate and 11.70 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 23: Further Preparation and Processing of Photoresist Composition

A positive-tone photoresist composition was prepared by combining 7.951 g of a 10 wt % solution of the polymer from Example 9 in ethyl lactate, 9.916 g of a 2 wt % solution of the acid generator 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate in ethyl lactate, 0.289 g of a 2 wt % solution of the compound of example 4 in ethyl lactate, 0.159 g of a 0.5 wt % solution of fluorinated surfactant (Omnova PF656) in ethyl lactate, 9.984 g of ethyl lactate and 11.70 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

TABLE 4

30 nm CH data. Normalized numbers over 1 indicate that the example is better than the comparatives for FOV CDU, LCDU and CER. Numbers below 1 indicate that the example is better than the comparatives for EL %

| Example | 30 nm FOV CDU (nm) | 30 nm LCDU (nm) | CER | EL % |
|---|---|---|---|---|
| Example 23 | ◇ | ◇ | ◇ | ◇ |
| Example 19 (comparative) | □ | □ | ■ | ■ |
| Example 20 (comparative) | □ | □ | ■ | □ |
| Example 21 (comparative) | ■ | ■ | ■ | ■ |
| Example 22 (comparative) | □ | □ | ▶ | ■ |

Example 24: Further Preparation and Processing of Photoresist Composition

A positive-tone photoresist composition was prepared by combining 11.832 g of a 10 wt % solution of the polymer from Example 9 in ethyl lactate, 14.757 g of a 2 wt % solution of the acid generator 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate in ethyl lactate, 1.021 g of a 2 wt % solution of the compound of example 5 in ethyl lactate, 0.237 g of a 0.5 wt % solution of fluorinated surfactant (Omnova PF656) in ethyl lactate, 14.60 g of ethyl lactate and 17.55 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

Example 25: Further Preparation and Processing of Photoresist Composition

A positive-tone photoresist composition was prepared by combining 11.947 g of a 10 wt % solution of the polymer from Example 9 in ethyl lactate, 14.900 g of a 2 wt % solution of the acid generator 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate in ethyl lactate, 1.219 g of a 0.5 wt % solution of tert-butyl 1,3-dihydroxy-2-(hydroxymethyl)propan-2-ylcarbamate in ethyl lactate, 0.239 g of a 0.5 wt % solution of fluorinated surfactant (Omnova PF656) in ethyl lactate, 14.145 g of ethyl lactate and 17.55 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

TABLE 5

30 nm CH data.

| Example | 30 nm FOV CDU (nm) | 30 nm LCDU (nm) | CER | EL % |
|---|---|---|---|---|
| Example 24 | ◇ | ◇ | ◇ | ◇ |
| Example 19 (comparative) | □ | □ | ■ | ■ |
| Example 25 (comparative) | ■ | ■ | □ | ▶ |

Example 26: Further Preparation and Processing of Photoresist Composition

A positive-tone photoresist composition was prepared by combining 9.973 g of a 10 wt % solution of the polymer from Example 10 in ethyl lactate, 11.65 g of a 2 wt % solution of the acid generator 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate in ethyl lactate, 0.640 g of a 2 wt % solution of example 8 in ethyl lactate, 1.167 g of a 0.5 wt % solution of tetrakis(2-hydroxypropyl)ethylenediamine in ethyl lactate, 0.199 g of a 0.5 wt % solution of fluorinated surfactant (Omnova PF656) in ethyl lactate, 11.742 g of ethyl lactate and 14.625 g of 2-hydroxyisobutyric acid methyl ester. The formulated resist was passed through a 0.01 μm PTFE filter. The thus prepared resist is spin coated onto a silicon wafer, soft baked to remove carrier solvent and exposed through a photomask to EUV radiation. The imaged resist layer is then baked at 110° C. for 60 seconds and then developed with an aqueous alkaline composition.

TABLE 6

30 nm CH data normalized to example 14.

| Example | 30 nm FOVCDU (nm) | 30 nm LCDU (nm) | 30 nm CER (nm) | 30 nm Esize (mJ) |
|---|---|---|---|---|
| Example 14 | 1 | 1 | 1 | 1 |
| Example 26 | 1.02 | 1.05 | 1.06 | 0.78 |

Example 27: Determination of pKa Values of Photogenerated Acids pKa Values were Calculated Based on the generated acid with ACD Labs (Advanced Chemistry Development, Inc., Toronto, Canada) structure design software version 12.5. Results are set forth in the following Table 7.

TABLE 7

Calculated pKa values in water.

| Onium Compound | pKa of the Acid Generated Upon Exposure |
|---|---|
| 5-(4-(2-(1-ethylcyclopentyloxy)-2-oxoethoxy)-3,5-dimethylphenyl)-5H-dibenzo[b,d]thiophenium 1,1-difluoro-2-(methacryloyloxy)ethanesulfonate | −2.7 +/− 0.5 |
| 5-phenyl-5H-dibenzo[b,d]thiophenium 1,1-difluoro-2-(methacryloyloxy)ethanesulfonate | −2.7 +/− 0.5 |
| 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate | −2.8 +/− 0.5 |
| 5-(4-(2-(1-ethylcyclopentyloxy)-2-oxoethoxy)-3,5-dimethylphenyl)-5H-dibenzo[b,d]thiophenium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate | −2.8 +/− 0.5 |
| 10-(5-((2-(1-ethylcyclopentyloxy)-2-oxoethoxy)carbonyl)-2-methoxyphenyl)-9-oxo-4,4a,9,10-tetrahydrothioxanthylium 3-hydroxyadamantane-acetoxy-1,1,2,2-tetrafluorobutane-1-sulfonate | −2.8 +/− 0.5 |
| Example 3 | 1.2 +/− 0.5 |
| Example 4 | 4.6 +/− 0.4 |
| Example 5 | 1.2 +/− 0.5 |
| Example 6 | 1.2 +/− 0.5 |
| Example 7 | 4.6 +/− 0.4 |
| Example 8 | 1.2 +/− 0.5 |

What is claimed is:

1. A photoresist composition, comprising:
   (i) a polymer;
   (ii) a first non-polymeric onium salt acid generator that produces a first acid upon exposure of the photoresist composition to activating radiation; and
   (iii) a second onium salt acid generator that 1) comprises a covalently bound acid-labile moiety and 2) produces a second acid upon exposure of the photoresist composition to activating radiation;
   wherein the first acid and second acid have pKa values that differ by at least 1; and
   the acid-labile moiety of the second onium salt acid generator is a group of the formula —C(=O)O(CH$_2$)$_n$(C=O)O-ALG, where n is an integer of from 1 to 12 and ALG is a group that results in an acid labile moiety.

2. The photoresist composition of claim 1 wherein the pKa value of the first acid is lower than the pKa value of the second acid.

3. A method for providing a photoresist relief image, comprising:
   a) applying a coating layer of a photoresist composition of claim 1 on a substrate; and
   b) exposing the photoresist composition layer to activating radiation and developing the exposed photoresist composition coating layer.

4. The method of claim 3 wherein the photoresist composition layer is exposed to EUV or e-beam radiation.

5. The photoresist composition of claim 1 wherein the first onium salt acid generator and the second onium salt acid generator are each not bound to a polymer.

6. The photoresist composition of claim 1 wherein at least one of the first onium salt acid generator and the second onium salt acid generator comprises a thioxanthone moiety.

7. The photoresist composition of claim 1 wherein at least one of the first onium salt acid generator and the second onium salt acid generator comprises a dibenzothiophene moiety.

8. The photoresist composition of claim 1 wherein the first acid and second acid have pKa values that differ by at least 1.5.

9. The photoresist composition of claim 1 wherein the first acid and second acid have pKa values that differ by at least 2.

10. The photoresist composition of claim 1 wherein the first acid and second acid have pKa values that differ by at least 3.

11. The photoresist composition of claim 1 wherein the first acid and second acid have pKa values that differ by at least 4.

12. The photoresist composition of claim 1 wherein both the first onium salt acid generator and the second onium salt acid generator are sulfonium compounds.

13. A photoresist composition of claim 1 further comprising a non-photo-destroyable base.

14. A photoresist composition, comprising:
(i) a polymer;
(ii) a first non-polymeric onium salt acid generator that produces a first acid upon exposure of the photoresist composition to activating radiation; and
(iii) a second onium salt acid generator that 1) comprises a covalently bound acid-labile moiety and 2) produces a second acid upon exposure of the photoresist composition to activating radiation;
wherein the first acid and second acid have pKa values that differ by at least 1;
wherein at least one of the first onium salt acid generator and the second onium salt acid generator comprises a thioxanthone moiety; and
wherein the first onium salt acid generator and the second onium salt acid generator are each not bound to a polymer.

15. A photoresist composition of claim 14 further comprising a non-photo-destroyable.

16. A photoresist composition of claim 14 wherein the acid-labile moiety of the second onium salt acid generator is a group of the formula $-C(=O)O(CH_2)_n(C=O)O\text{-ALG}$, where n is an integer of from 1 to 12 and ALG is a group that results in an acid labile moiety.

* * * * *